United States Patent
Sakamoto et al.

(10) Patent No.: US 7,251,149 B2
(45) Date of Patent: Jul. 31, 2007

(54) SEMICONDUCTOR MEMORY DEVICE PROVIDED WITH A WRITE COLUMN SELECTION SWITCH AND A READ COLUMN SELECTION SWITCH SEPARATELY

(75) Inventors: Masatoshi Sakamoto, Hamura (JP); Masatoshi Hasegawa, Ome (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/506,834

(22) Filed: Aug. 21, 2006

(65) Prior Publication Data

US 2006/0280001 A1    Dec. 14, 2006

Related U.S. Application Data

(63) Continuation of application No. 10/625,573, filed on Jul. 24, 2003, now abandoned.

(30) Foreign Application Priority Data

Jul. 26, 2002    (JP) .............................. 2002-218020

(51) Int. Cl.
   *G11C 5/06*    (2006.01)
(52) U.S. Cl. ............... 365/63; 365/189.01; 365/230.03
(58) Field of Classification Search .................. 365/51, 365/63, 189.01, 230.03
   See application file for complete search history.

(56) References Cited

U.S. PATENT DOCUMENTS 5,506,808 A    4/1996 Yamada et al.
5,724,291 A    3/1998 Matano
6,314,042 B1    11/2001 Tomishima et al.
6,339,560 B1    1/2002 Naritake
6,359,825 B1    3/2002 Aimoto et al.
6,418,067 B1    7/2002 Watanabe et al.

FOREIGN PATENT DOCUMENTS

| JP | 3-272090 | 3/1990 |
| JP | 4-85793 | 7/1990 |
| JP | 5-28752 | 7/1991 |
| JP | 5-28753 | 7/1991 |
| JP | 5-28766 | 7/1991 |
| JP | 5-62463 | 8/1991 |
| JP | 5-258567 | 3/1992 |
| JP | 9-161483 | 11/1995 |
| JP | 2000-132969 | 10/1998 |

*Primary Examiner*—Van Thu Nguyen
(74) *Attorney, Agent, or Firm*—Reed Smith LLP; Stanley P. Fisher, Esq.; Juan Carlos A. Marquez, Esq.

(57) ABSTRACT

A Y selection line for write for controlling operations of a column selection switch within a write amplifier and a Y selection line for read for controlling operations of a column selection switch within a read amplifier are provided individually and the column selection switch within the read amplifier is set to the non-operating condition during the write operation. Accordingly, a through-current during the write operation may be reduced. In this case, the write IO line and read IO line are allocated crossing sense amplifier columns, while the column selection line for write and column selection line for read are allocated in parallel to the sense amplifier columns.

4 Claims, 14 Drawing Sheets

SEMICONDUCTOR MEMORY DEVICE PROVIDED WITH A WRITE COLUMN SELECTION SWITCH AND A READ COLUMN SELECTION SWITCH SEPARATELY

CROSS-REFERENCE TO RELATED APPLICATION

This application is a Continuation application of U.S. application Ser. No. 10/625,573 filed Jul. 24, 2003 now abandoned. Priority is claimed based on U.S. application Ser. No. 10/625,573 filed Jul. 24, 2003, which claims the priority of Japanese Patent Application No. 2002-218020 filed Jul. 26, 2002, all of which is incorporated by reference.

BACKGROUND OF THE INVENTION

The present invention relates to a semiconductor memory device and more particularly to a technical means to reduce a through-current flowing in the same device and a technical means to optimize the column selection timing.

As an example of a semiconductor memory device, a dynamic random access memory (hereinafter, abbreviated as "DRAM") has been proposed. This DRAM is comprised of a plurality of dynamic memory cells which are allocated in the structure of an array. Regarding such semiconductor memory device, a technical means has been proposed to utilize a column selection signal in a write execution section and a read execution section of the semiconductor memory device wherein a column change-over switch is provided and a write control section and a read control section are respectively provided with the write execution section and the read execution section for every column (Japanese Patent Application Publication Nos. Hei 4(1992)-85793, Hei 5(1993)-258567, Hei 9(1997)-161483 (corresponding U.S. Pat. No. 5,724,291) and 2000-132969 (corresponding U.S. Pat. No. 6,359,825B1)).

Moreover, a technical means to control a read column switch and a write column switch with independent signal lines in the semiconductor memory device has also been proposed (Japanese Patent Application Publication No. Hei 5(1993)-62463).

SUMMARY OF THE INVENTION

The inventors of the present invention have found, as a result of investigation on the semiconductor memory device wherein a column selection switch for write to transfer the write data transferred via a write IO line to the bit line and a column section switch for read to selectively transfer the read data of bit line to a read IO line are controlled for the operation with the common control signal, that the column selection switch for read is turned ON even during the write operation, the through-current flows in some cases between a precharge circuit of the read IO line and a read amplifier, and thereby power consumption is increased. For example, as illustrated in FIG. 6, when a read amplifier consisting of the n-channel MOS transistors 601, 602, 603, 604 is coupled with the complementary bit lines BLT, BLB and data of the complementary bit lines BLT, BLB can be transferred to the read IO lines (RIOT, RIOB) with this read amplifier, a through-current flows through the read IO line in the high level side among the complementary bit lines BLT, BLB when the column selection signal YS is set to the high level under the condition that the p-channel MOS transistors 605, 606 for precharge of the read IO line are turned ON during the write operation.

In general, it is recommended to extend the time to drive the bit line based on the write data in order to surely write the data to a memory cell during the write operation. Namely, it is better to extend the time to select the column during the write operation. On the other hand, since the column selection is no longer required, during the read operation, after the read data are transferred to a main amplifier from the memory cell, it is desirable to set up the preparation for the next read operation cycle by quickly setting the column selection switches to the non-selecting condition.

However, in the circuit structure to control the operations of the column selection switch for write which can transfer the write data transferred via the write IO line to the bit line and the column selection switch for read which can selectively transfer the read data of bit line to the read IO line with the common control signal, since it is impossible to independently control the column selection switch for write and the column selection switch for read, it is assumed difficult to optimize the column selection timing.

Moreover, even in the circuit structure to independently control the column switch for read and column switch for write with the signal lines, it can also be assumed that the through-current flows depending on the timing control of the column switch for read and the column switch for write. In addition, even in the circuit structure to independently control the column switch for read and the column switch for write with the signal lines, it is still difficult to optimize the column selection timing, if it is not obvious how the control signal is generated and then supplied.

An object of the present invention is to provide a technical means to reduce a through-current.

Another object of the present invention is to provide a technical means to easily optimize the column selection timing.

The aforementioned objects and the other objects of the present invention and the novel features thereof will become apparent from the description of this specification and the accompanying drawings.

Typical inventions of the present invention disclosed in this specification will be briefly described as follows.

Namely, the semiconductor memory device of the present invention comprises a write IO line to fetch the write data, a column selection switch for write which can transfer the write data transferred via the write IO line to the bit line, a column section switch for write which can supply an operation control signal of the column selection switch for write to the column selection switch for write, a sense amplifier column consisting of a plurality of sense amplifier circuits to amplify the read data which is read to the bit line from memory cells, a read IO line for data read, a column selection switch for read which can selectively transfer the read data of the bit line to the read IO line, a column selection line for read to supply the operation control signal of the column selection switch for read to the column selection switch for read, and a control means which can control the operations of the column selection switch for write and the column selection switch for read in different timings. In this semiconductor memory device, the write IO line and read IO line are allocated crossing the sense amplifier column and the column selection line for write and column selection line for read are allocated in parallel to the sense amplifier column.

According to the means described above, the column selection switch for write and the column selection switch for read are operated in different timings and thereby reduction of through-current may be attained. In more practical, since the Y selection line WYS for write to control the operation of the column selection switch in the write amplifier is isolated from the Y selection line RYS for read to control the operation of the column selection switch in the read amplifier, the column selection switch in the read amplifier may be set to the non-operating condition during the write operation. As a result, a through-current during the write operation may be reduced.

Moreover, since the write IO line and read IO line are allocated crossing the sense amplifier column and the column selection line for write and column selection line for read are allocated in parallel to the sense amplifier column, the wiring area of the column selection lines can be attained. In more practical, when the Y selection line YS is isolated to the Y selection line WYS for write and the Y selection line RYS for read, the total number of Y selection lines is increased up to two times in comparison with the total number when the Y selection line YS is not isolated. Therefore, the write IO line and read IO line are allocated crossing the sense amplifier column, and the column selection line for write and column selection line for read are allocated in parallel to the sense amplifier column in order to employ the layout where the small number of Y selection lines YS are used. Accordingly, even when the total number of Y selection lines YS is doubled, the wiring area of the Y selection lines YS may be acquired easily.

The sense amplifier circuit comprises a write amplifier section to drive the bit line based on the data of the write IO line and a read amplifier section to drive the read IO line based on the data of bit line, and is also provided with a column selection line for write utilizing the wiring layer in the area where the write amplifier section is formed and with a column selection line for read utilizing the wiring layer in the area where the read amplifier section is formed. In more practical, when the Y selection line is divided into the Y selection line WYS for write and the Y selection line RYS for read, even if the write amplifier section and read amplifier section are allocated adjacently with each other and even if the sense amplifier section and precharge section are allocated between the write amplifier section and read amplifier section, wiring load may be restricted not to increase and thereby a degree of freedom of layout can be incremented by wiring the Y selection line WYS for write utilizing the wiring layer in the area where the write amplifier section is formed and by wiring the Y selection line RYS for read utilizing the wiring layer in the area where the read amplifier section is formed.

When a semiconductor memory device is comprised of a write IO line to fetch the write data, a column selection switch for write to transfer the write data transferred via the write IO line to the bit line, a column selection line for write to supply the operation control signal of the column selection switch for write to the column selection switch for write, a sense amplifier column consisting of a plurality of sense amplifier circuits allocated to amplify the read data which is read to the bit line from the memory cell, a column selection switch for read to selectively transfer the read data of the bit line to the read IO line, a column selection line for read to supply the operation control signal of the column selection switch for read to the column selection switch for read, a decoder to generate the signal to control the operation of the column selection switch for write and column selection switch for read in the timings which are different with other, and a precharge circuit to precharge the read IO line, the precharge of the read IO line is started with the precharge circuit in the timing which is earlier than the timing for turning OFF the column selection switch for read. Such control may be realized with the signal generated by the decoder. In more practical, the precharge control signal is also included to the decoding condition of the decoder.

Moreover, when a semiconductor memory device is comprised of a lead IO line to read the data, a main amplifier to read and amplify the data of IO line and a precharge circuit to precharge the read IO line, it is also possible to provide a means to start the precharge of the read IO line with the precharge circuit in the timing that the operation of main amplifier is started. This means may be realized, in more practical, with a main amplifier control circuit. Here, to realize the high-speed read operation, it is required to quickly assert the IO precharge control signal for read in order to realize quick precharge of IO line for read. However, when the timing to start the precharge is set quickly, the time required by the through-current to flow may be so far extended. Therefore, increase of the through-current when the precharge timing is set quickly may be avoided by quickly setting the Y selection line for read to the non-selecting condition. Such control may be realized easily by fetching the main amplifier control signal outputted from the main amplifier control circuit as the decoding condition of the decoder. The same effect can also be attained even when the timing to assert the IO precharge control signal for read is set almost equal to the timing to set the Y selection line for read to the non-selecting condition.

DETAILED DESCRIPTION OF THE PREFERRED EMBODIMENT

Figure 15:
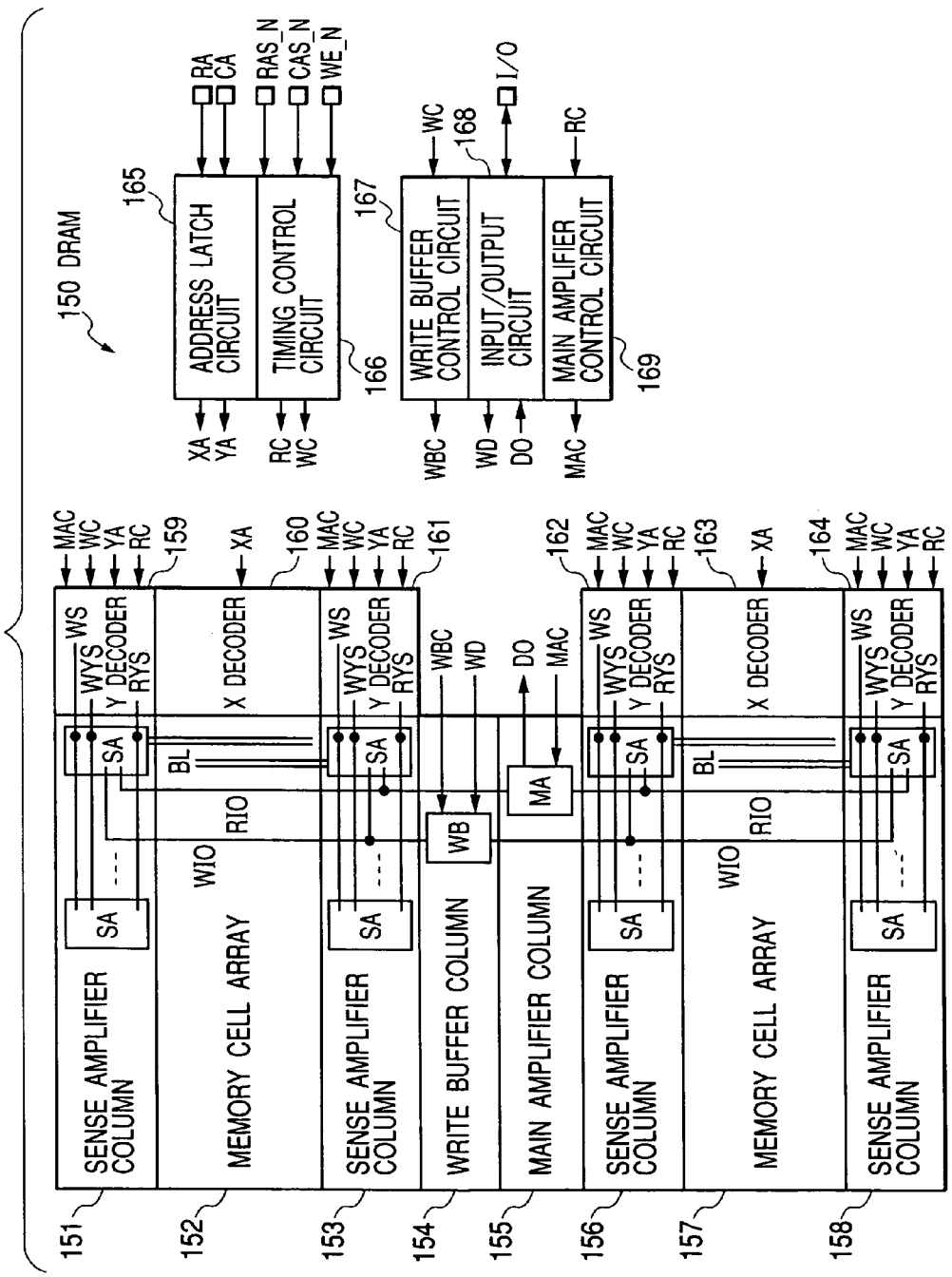
FIG. 15 is a total block diagram of an example of structure of the DRAM as an example of the semiconductor memory device of the present invention.

FIG. 15 illustrates a DRAM (Dynamic Random Access Memory) which is an example of a semiconductor memory device of the present invention.

The DRAM 150 illustrated in FIG. 15 comprises, although not particularly restricted, sense amplifier columns 151, 153, 156, 158, memory cell arrays 152, 157, a main amplifier column 155, a write buffer column 154, Y (column) decoders 159, 161, 162, 164, X (row) decoders 160, 163, an address latch circuit 165, a timing control circuit 166, a write buffer control circuit 167, an input/output circuit 168, and a main amplifier control circuit 169 and is then formed on one semiconductor substrate such as a single crystal silicon substrate with the well known semiconductor integrated circuit manufacturing technique.

The memory cell arrays 152, 157 are formed of a matrix layout of a plurality of dynamic memory cells. The selection terminal of this memory cell is connected to the word line in each row direction, while the data input terminal of this memory cell is connected to the complementary bit lines in each column direction. The respective complementary bit lines are connected in common to the complementary common data lines via a Y selection switch circuit 14 including a plurality of column selection switches coupled on one to one basis to the complementary bit lines.

The address latch circuit 165 latches row addresses RA and column addresses CA inputted via the address input terminal in order to fetch these addresses to the internal side. The row address and column address outputted after these are latched by the address latch circuit 165 are respectively expressed as XA, YA and discriminated from RA, CA. The row address signal XA is then transferred to the X decoders 160, 163.

The X decoders 160, 163 generate a word line selection signal to select only one word line from a plurality of word lines by decoding the row address XA inputted via the address latch circuit 165.

The Y decoders 159, 161, 162, 164 generate a column selection signal by decoding the column address signal YA inputted via the address latch circuit 165. As the decoding conditions of these decoders, a main amplifier control signal MAC from the main amplifier control circuit 169, a control signal RC for read, and a control signal WC for write from the timing control circuit 166 are fetched.

The sense amplifier columns 151, 153, 156, 158 are formed of a layout of a plurality sense amplifiers SA to amplify the read data which is read to the bit line from the memory cell.

The main amplifier column 155 is formed of a layout of a plurality of main amplifier circuits MA to amplify the read data transferred to the read IO line from the bit line.

The input/output circuit 168 comprises an input circuit for fetching the write data via the input/output (I/O) terminals and an output circuit for outputting the output data DO from the main amplifier column to an external circuit.

The write buffer column 154 is formed of a layout of a plurality of write buffers WB to drive the IO line for write based on the write data WD outputted from the input/output circuit 168.

The timing control circuit 166 generates a read system timing control signal RC and a write system timing control signal WC to control operation of each section in the adequate timing on the basis of a row address strobe signal RAS_N (N indicates that the relevant signal is the row active state) indicating the validity of row address, a column address strobe signal CAS_N indicating validity of column address, and a write enable signal WE_N indicating a write condition. The read system timing control signal RC includes a read signal YIORB indicating the read condition. Moreover, the write system timing control signal WC includes a write signal YIOWB indicating the write condition.

The write buffer control circuit 167 generates a write buffer control signal WBC to control operation of the write buffer column 154 based on the write control signal WC.

The main amplifier control circuit 169 generates a main amplifier control signal MAC to control the main amplifier column 155 based on the control signal RC for read. The main amplifier control signal MAC includes an IO precharge control signal RIOPR for read for control of IO precharge for read, a shared control signal MASHR for shared control in the main amplifier, a main amplifier enable signal MAE for activation of the main amplifier, and a main amplifier precharge control signal MAPR for control of main amplifier precharge.

Next, detail structure of each section will be described below.

Figure 1:
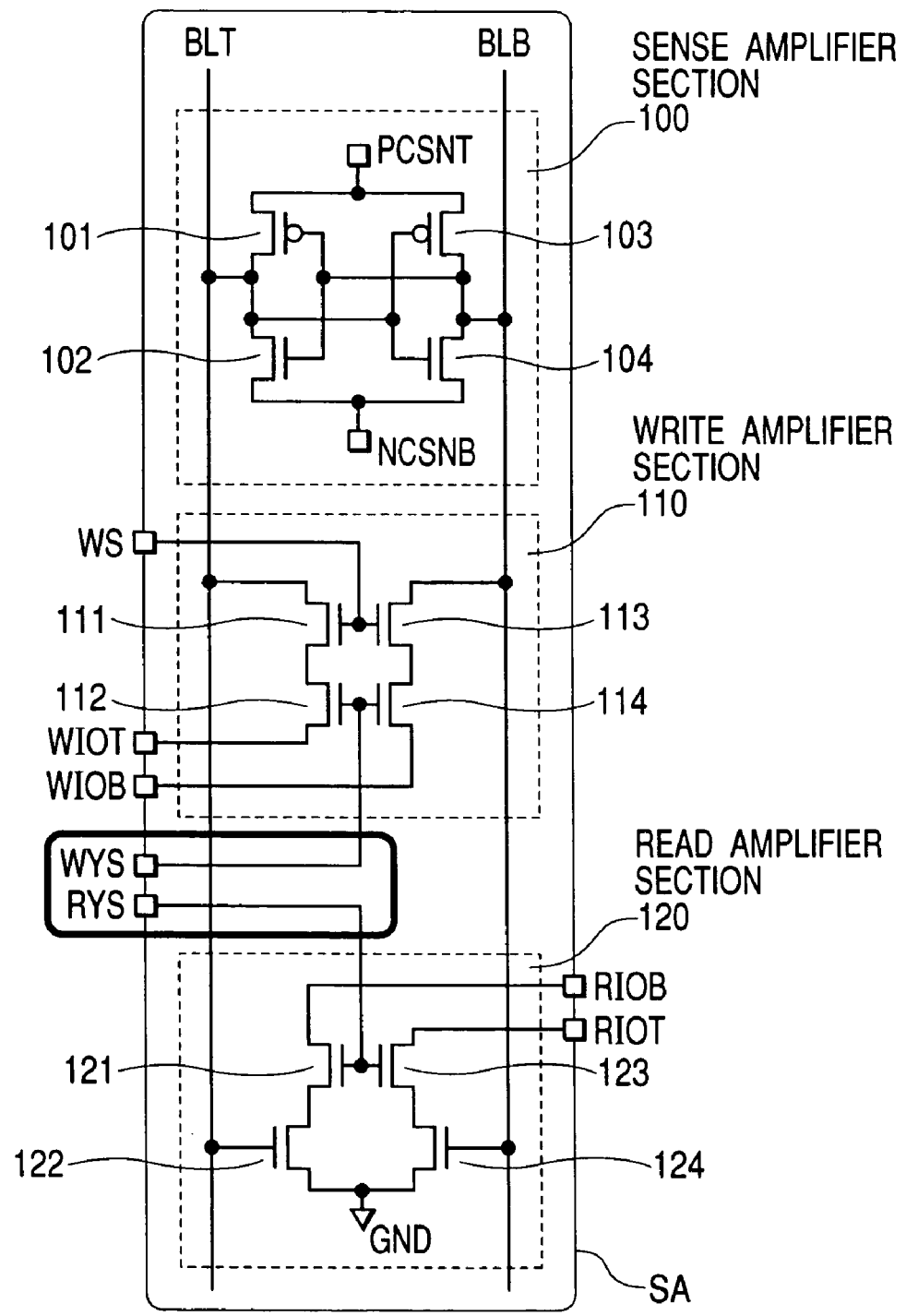
FIG. 1 is a circuit diagram illustrating an example of structure of the principal portion of a DRAM as an example of the semiconductor memory device of the present invention.

FIG. 1 illustrates an example of a structure of a sense amplifier circuit SA among a plurality of sense amplifiers forming the sense amplifier columns 151, 153, 156, 158.

The sense amplifier circuit SA illustrated in FIG. 1 is formed, although not particularly restricted, of a layout of a sense amplifier section 100, a write amplifier section 110 and a read amplifier section 120 corresponding to a pair of complementary bit lines BLT, BLB.

The sense amplifier section 100 has the function to amplify a voltage difference of the complementary bit lines BLT, BLB and is formed of a loop-coupling of a first inverter which is formed of serial connection of a p-channel MOS transistor 101 and an n-channel MOS transistor 102 and a second inverter which is formed of serial connection of a p-channel MOS transistor 103 and an n-channel MOS transistor 104. The source electrodes of the p-channel MOS transistors 101, 103 are connected to a high potential side power supply PCSNT for sense amplifier. This high potential side power supply PCSNT for sense amplifier is set to the voltage level of the high potential side power supply VDD during operation of the sense amplifier section 100 and to the ½ voltage level (VDD/2) of the high potential side power supply VDD during non-operation of the sense amplifier section 100. The source electrodes of the n-channel MOS transistors 102, 104 are connected to the low potential power supply NCSNB for sense amplifier. This low potential side power supply NCSNB for sense amplifier is set to the voltage level of low potential power supply VSS during operation of the sense amplifier section 100 and to the ½ voltage level (VDD/2) of the high potential side power supply VDD during non-operation of the sense amplifier section 100. The serial connection node of the p-channel MOS transistor 101 and the n-channel MOS transistor 102 is connected to the bit line BLT, while the serial connection node of the p-channel MOS transistor 103 and the n-channel MOS transistor 104 is connected to the bit line BLB.

The write amplifier section 110 has the function to drive the bit lines BLT, BLB based on the data of the write IO lines WIOT, WIOB and includes the n-channel MOS transistors 111, 112, 113, 114. The n-channel MOS transistors 111, 112 and n-channel MOS transistors 113, 114 are respectively connected in serial. The gate electrodes of the n-channel MOS transistors 111, 112 are coupled with the write selection line WS and this write selection line WS is set to the high level. Thereby, the n-channel MOS transistors 111, 113 are set to the conductive state. Moreover, the gate electrodes of the n-channel MOS transistors 112, 114 are coupled with the Y selection line WYS for write and this Y selection line WYS for write is set to the high level. Thereby, the n-channel MOS transistors 112, 114 are set to the conductive state. The n-channel MOS transistors 112, 114 are formed as the column selection switches and the signal of Y selection line WYS for write is generated by the corresponding Y decoders 159, 161, 162, 164. During the period where the n-channel MOS transistors 112, 114 and the n-channel MOS transistors 111, 113 are set to the conductive state, the bit lines BLT, BLB are driven based on the data of the IO lines WIOT, WIOB for write.

The read amplifier section 120 has the function to drive the read IO lines RIOT, RIOB based on the data of bit line and is formed of the n-channel MOS transistors 121, 122, 123, 124 which are connected with each other. The gate electrodes of the n-channel MOS transistors 121, 123 are coupled with the Y selection line RYS for read and the data of bit line can be read under the condition that the Y selection line RYS for read is set to the high level and thereby the n-channel MOS transistors 121, 123 are turned ON. The n-channel MOS transistors 121, 123 are formed as the column selection switches and the signal of the Y selection line RYS for read is generated with the corresponding Y decoders 159, 161, 162, 164.

Figure 3:
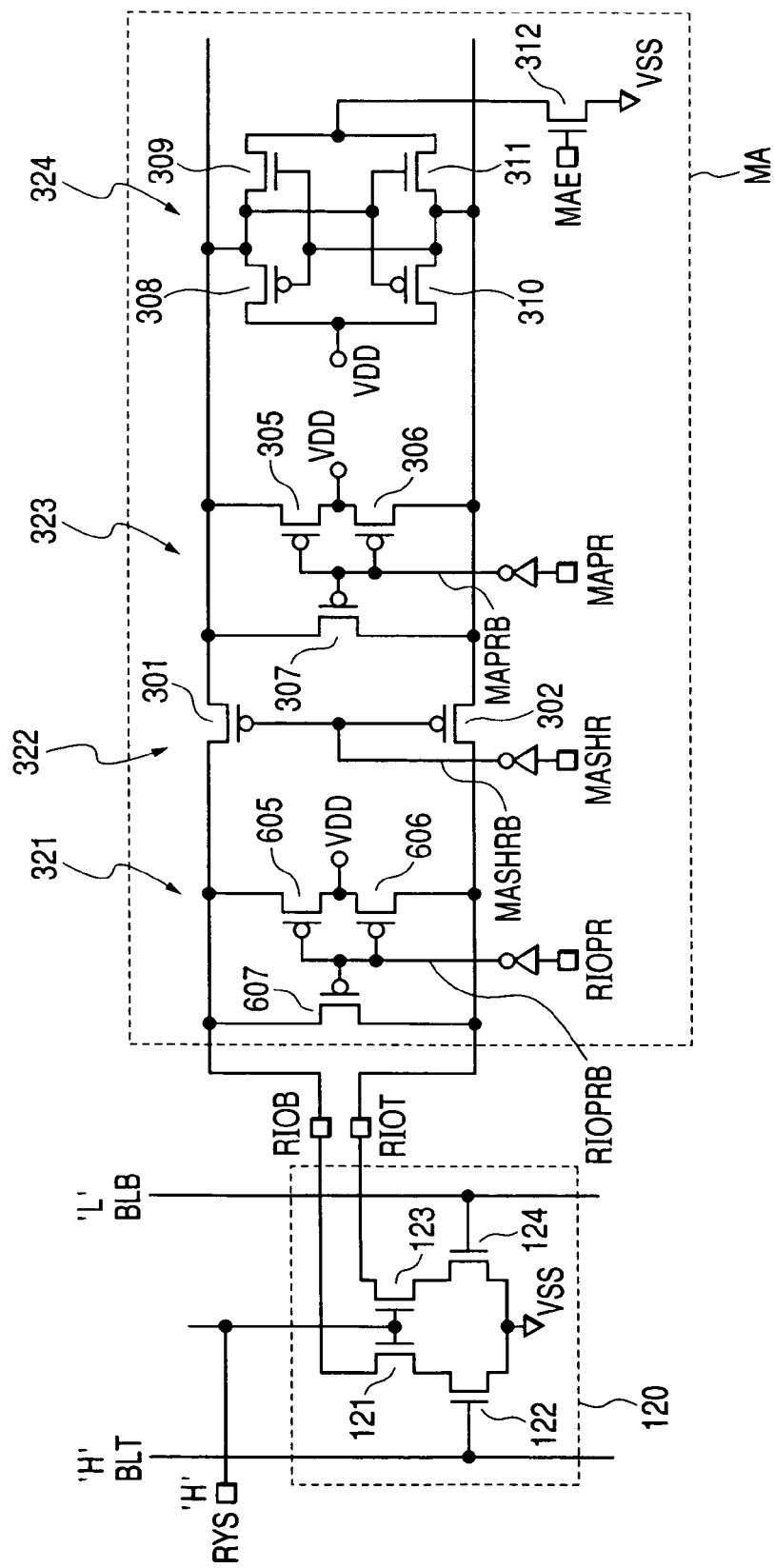
FIG. 3 is a circuit diagram illustrating an example of structure of the principal portion in the DRAM.

FIG. 3 illustrates an example of structure of one main amplifier circuit MA among a plurality of main amplifier circuits forming the main amplifier column 155.

The main amplifier circuit MA comprises a precharge circuit 321 to precharge the IO lines RIOT, RIOB for read, a shared circuit 322 for circuit isolation, a main amplifier section 324 to amplify the signal transferred via the shared circuit 322, a precharge circuit 323 to precharge a signal line of the main amplifier 324, and an n-channel MOS transistor 312 to change over the operating condition and non-operating condition of the main amplifier section 324 based on the main amplifier enable signal MAE.

The precharge circuit 321 comprises p-channel MOS transistors 605, 606 which can supply voltage of the high potential side power supply VDD to the IO lines RIOT, RIOB for read, based on the logically inverted signal RIO-PRB of the IO precharge control signal RIOPR for read and a p-channel MOS transistor 607 which can terminates the IO lines RIOT, RIOB for read, based on the logically inverted signal RIOPRB of the IO precharge control signal RIOPR for read. The serial connection node of the p-channel MOS transistors 605, 606 is coupled with the high potential side power supply VDD.

The shared circuit 322 comprises p-channel MOS transistors 301, 302 for coupling the IO lines RIOT, RIOB for read to the main amplifier section 324 based on the logically inverted signal MASHRB of the shared control signal MASHR. To the gate electrodes of the p-channel MOS transistors 301, 302, the logically inverted signal MASHRB of the shared control signal MASHR is supplied. During the period where the shared control signal MASHR is asserted to the high level, the p-channel MOS transistors 301, 302 are turned ON and thereby the IO lines RIOT, RIOB for read are coupled with the main amplifier section 324.

The main amplifier section 324 is formed of a loop-coupling of a first inverter formed of a serial connection of a p-channel MOS transistor 308 and an n-channel MOS transistor 309 and a second inverter formed of a serial connection of a p-channel MOS transistor 310 and an n-channel MOS transistor 311. The source electrodes of the p-channel MOS transistors 308, 310 are coupled with the high potential side power supply VDD. The source electrodes of the n-channel MOS transistors 309, 311 are coupled with the low potential side power supply VSS via the n-channel MOS transistor 312.

The precharge circuit 323 comprises p-channel MOS transistors 305, 306 which can supply a voltage of the high potential side power supply VDD to the complementary signal lines of the main amplifier section 324, based on the logically inverted signal MAPRB of the main amplifier precharge control signal MAPR, and a p-channel MOS transistor 307 which can terminate the complementary signal lines of the main amplifier section 324, based on the logically inverted signal MAPRB of the main amplifier precharge control signal MAPR. The serial connection node of the p-channel MOS transistors 305, 306 is coupled with the high potential side power supply VDD.

Although not illustrated in FIG. 3, the circuits similar to the shared circuit 322 and precharge circuit 321 are also provided in the right side of the main amplifier section 324.

Figure 4:
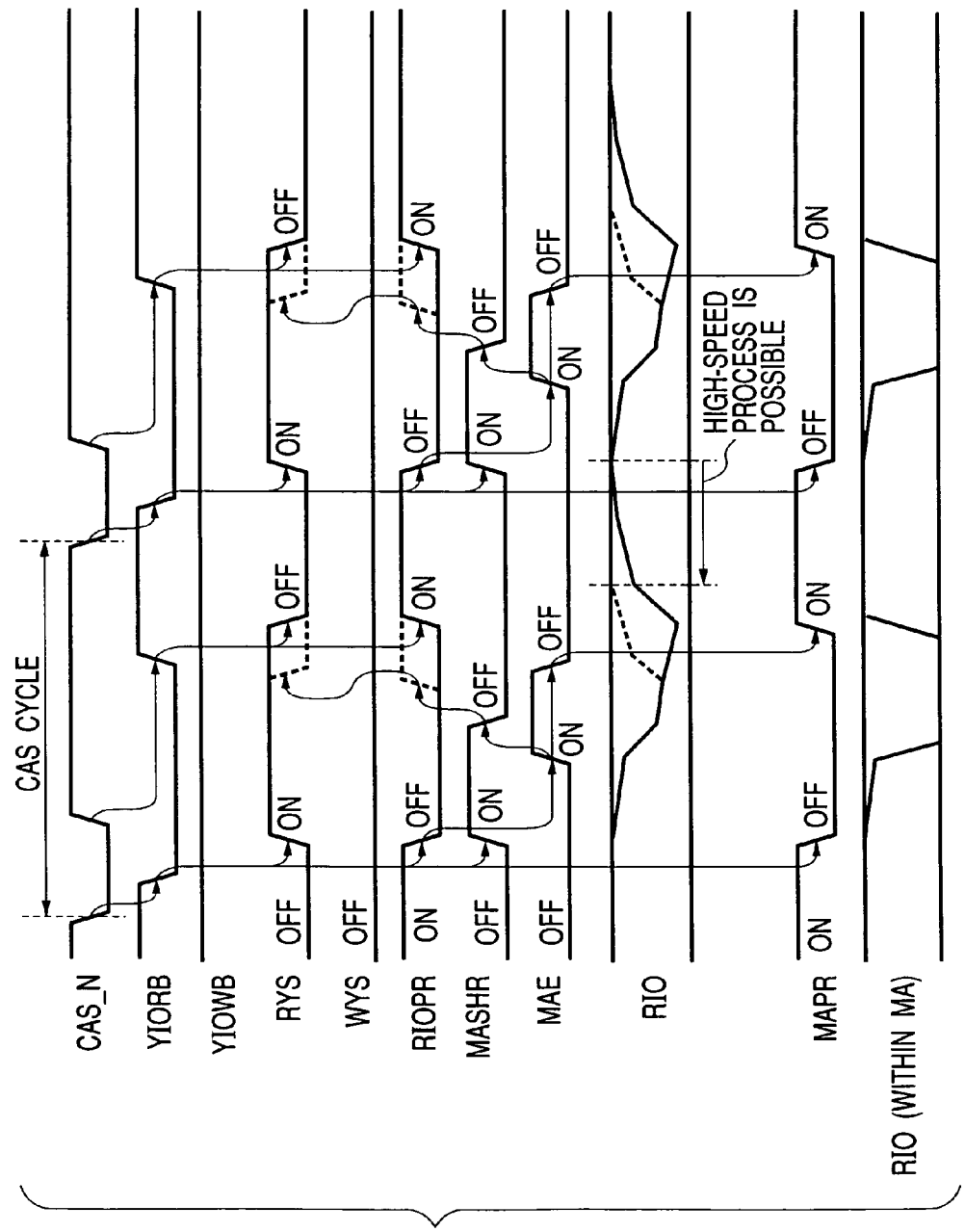
FIG. 4 is an operation timing diagram in the read operation of the DRAM.

FIG. 4 illustrates the operation timings of the principal portions during the read operation of the DRAM.

The data of DRAM is read when the read signal YIORB illustrated in FIG. 15 is asserted to the low level. During the read operation, the precharge is suspended because the IO precharge control signal RIOPR for read and the main precharge control signal MAPR are negated to the low level, the p-channel MOS transistors 301, 302 are turned ON when the shared control signal MASHR is asserted to the high level, and thereby the IO lines RIOT, RIOB for read are set to the conductive state to the main amplifier section 324. In this timing, the sense amplifier circuit SA starts to output the read data when the Y selection line RYS for read is set to the high level. In the timing where a certain amount of data are transferred to the IO lines RIOT, RIOB for read via the read amplifier 120, the main amplifier section 324 starts the amplification operation when the main amplifier enable signal MAE is asserted to the high level. When the shared control signal MASHR is negated to the low level and the p-channel MOS transistors 301, 302 are turned OFF, upon start of amplifying operation by the main amplifier section 324, a load of the main amplifier section 324 is reduced. Thereafter, the Y selection line RYS for read is set to the low level, the IO precharge control signal RIOPR for read is asserted to the high level, and thereby the precharge of the IO lines RIOT, RIOB for read is started. Moreover, when the main amplifier precharge control signal MAPR is asserted again to the high level after the data is amplified with the main amplifier section 324, the complementary signal lines of the main amplifier section 324 are precharged.

In order to realize high-speed read operation, it is required to quickly precharge the IO lines RIOT, RIOB for read by quickly asserting the IO precharge control signal RIOPR for read as indicated by a broken line in FIG. 4. Namely, the precharge of the IO lines RIOT, RIOB for read is started by quickly asserting the IO precharge control signal RIOPR for read after the main amplifier enable signal MAE is asserted to the high level and thereby the operation of main amplifier section 324 is started. However, when the precharge start timing is set earlier, the period where a through-current flows is as much extended. In this embodiment, increment of through-current when the precharge timing is set earlier may be avoided by quickly setting the Y selection line RYS for read to the selected condition. Such control may be realized by fetching the main amplifier control signal MAC outputted from the main amplifier control circuit 169 as the decoding conditions in the Y decoders 159, 161, 162, and 164. In other words, it is enough when the timing to set the Y selection line RYS for read to the non-selecting condition is determined with reference to the IO precharge control signal RIOPR for read included in the main amplifier control signal MAC.

The effect similar to that described above can also be obtained even when the timing to assert the IO precharge control signal RIOPR for read is almost matched with the timing to set the Y selection line RYS for read to the non-selecting condition.

Figure 5:
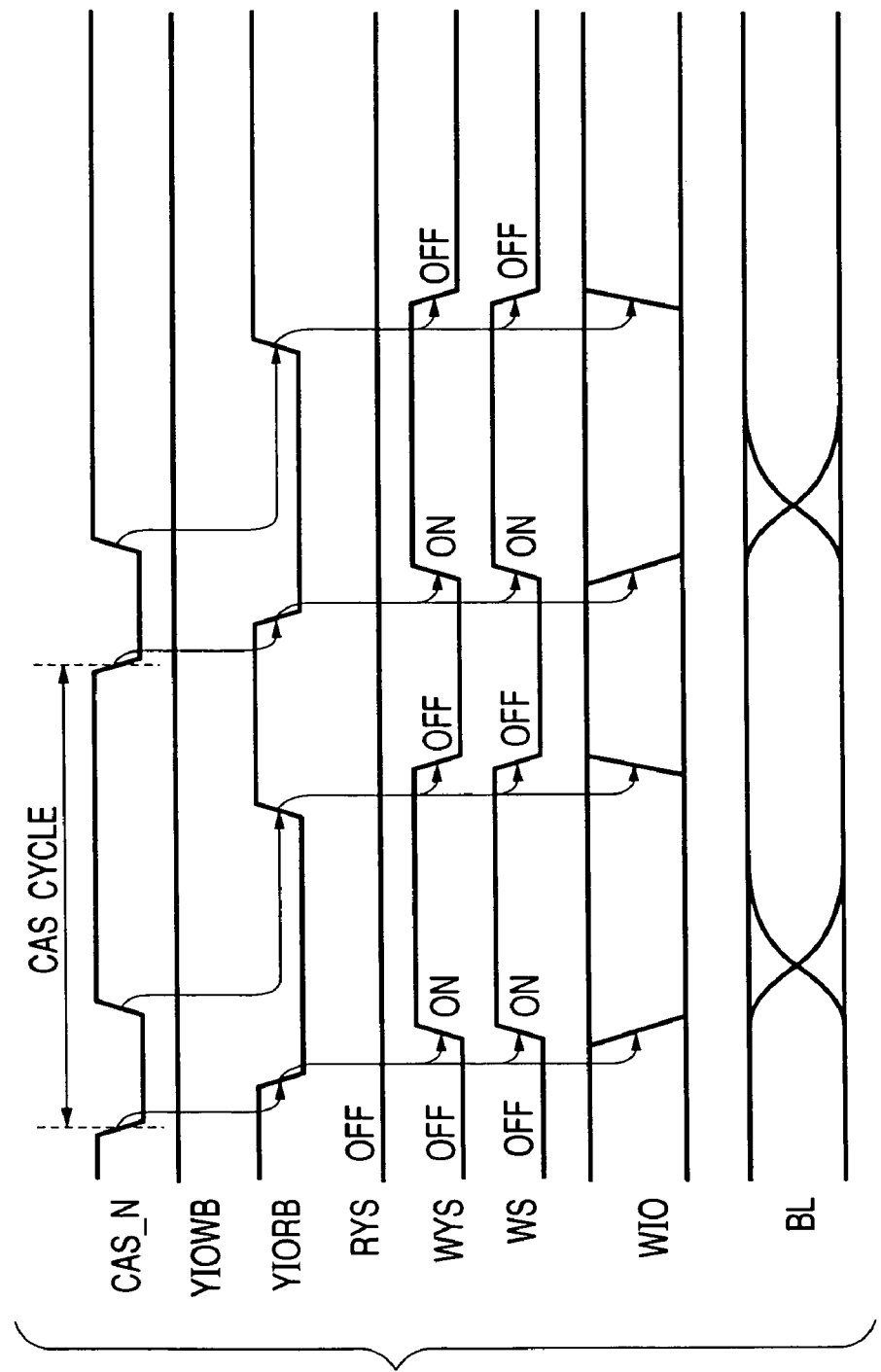
FIG. 5 is an operation timing diagram in the write operation of the DRAM.

FIG. 5 illustrates the operation timings of the principal portions during the write operation of the DRAM described above.

During the write operation, the write data are transferred to the IO lines WIOT, WIOB for write and the Y selection line WYS for write and the write selection line WS are set to the high level. Accordingly, the write data are supplied to the bit lines BLT, BLB and the information stored in the memory cell is updated with such write data.

Figure 2:
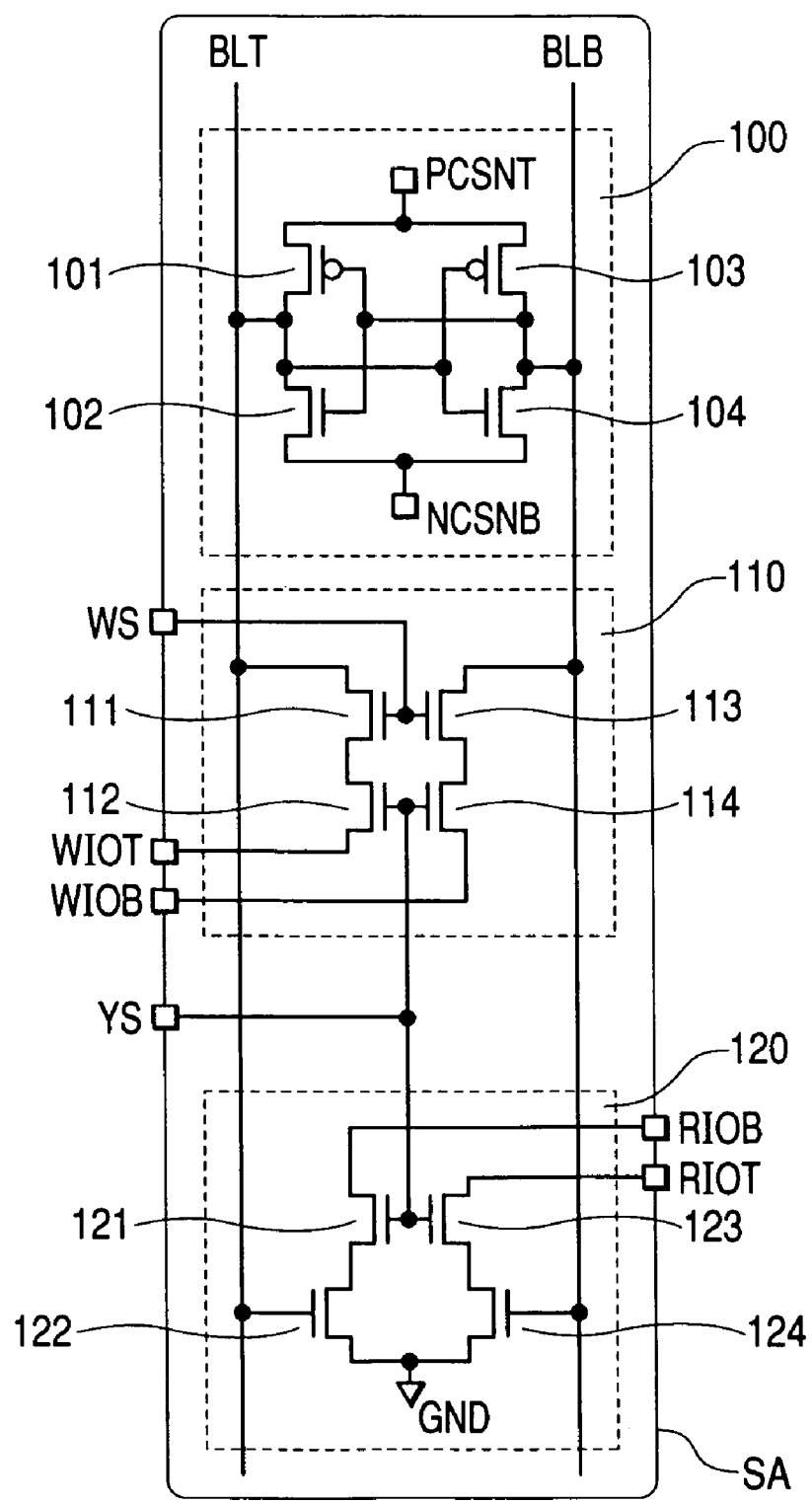
FIG. 2 is a circuit diagram illustrating an example of structure of the circuit as the comparison object of the circuit illustrated in FIG. 1.

In FIG. 2, a circuit structure as the comparison object of the sense amplifier circuit SA illustrated in FIG. 1 is illustrated. In this circuit structure illustrated in FIG. 2, the gate electrodes of the n-channel MOS transistors 112, 114, 121, 123 forming the column selection switch are coupled to the common Y selection line. Namely, the column selection switch in the Y selection line YS and that in the read amplifier 120 are controlled in the drive almost simultaneously with the selection signal transferred with the Y selection line YS. During the write operation, the read system circuit is unnecessary. Therefore, during the write operation, the IO lines RIOT, RIOB for read are precharged with the p-channel MOS transistors for precharge 605, 606 and when the Y selection line YS is set to the high level under this condition, the n-channel MOS transistors 603, 604 are turned ON and thereby unwanted through-current flows into the circuit. In addition, since the Y selection line YS is connected in common to all sense amplifier circuits SA within the same sense amplifier column, a load viewed from the corresponding Y decoders 159, 161, 164 increases. Moreover, it is no longer possible to control the operations of the column selection switch (112, 114) in the write amplifier 110 and that (121, 123) in the read amplifier 120 in different timings.

Figure 6:
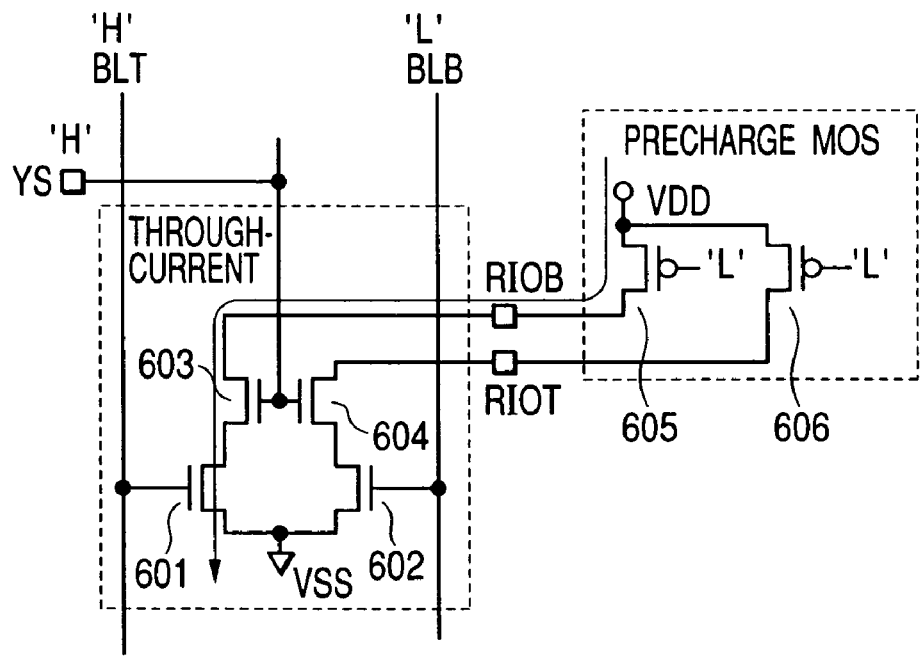
FIG. 6 is a circuit diagram illustrating a through-current bus in the DRAM.

Meanwhile, since the Y selection line WYS for write to control the operation of the column selection switch (112, 114) within the write amplifier 110 is isolated from the Y selection line RYS for read to control the operation of the column selection switch (121, 123) within the read amplifier 120 in the circuit structure illustrated in FIG. 1, the column selection switch (121, 123) within the read amplifier 120 can be set to the non-operating condition during the write operation. Therefore, the through-current as illustrated in FIG. 6 does not flow during the write operation.

Moreover, in this embodiment, since the Y selection line is divided into the Y selection line WYS for write and the Y selection line RYS for read, a load viewed from the corresponding Y decoders 159, 161, 162, 164 is decreased to a half of the load in the case of FIG. 2. Therefore, high-speed drive of the column selection switch can be realized.

Furthermore, it is recommended for realization of high-speed precharge operation to make short the period to set the Y selection line RYS for read to the high level. On the other hand, it is required, to surely write the data into the memory cell during the write operation, to make longer the period to set the Y selection line WYS for write to the high level. According to this embodiment, since the Y selection line is divided into the Y selection line WYS for write and the Y selection line RYS for read, the column selection switch (112, 114) within the write amplifier 110 and the column selection switch (121, 123) within the read amplifier 120 can be controlled for the operation in different timings. Accordingly, following timing control may be realized very easily. Namely, the period to set the Y selection line RYS for read to the high level may be set as a short period in order to realize high-speed precharge operation, while the period to set the Y selection line WYS for write to the high level may be set as a longer period in order to surely write the data to the memory cell during the write operation.

Next, the layout of the principal portion of the DRAM will be described.

Figure 8:
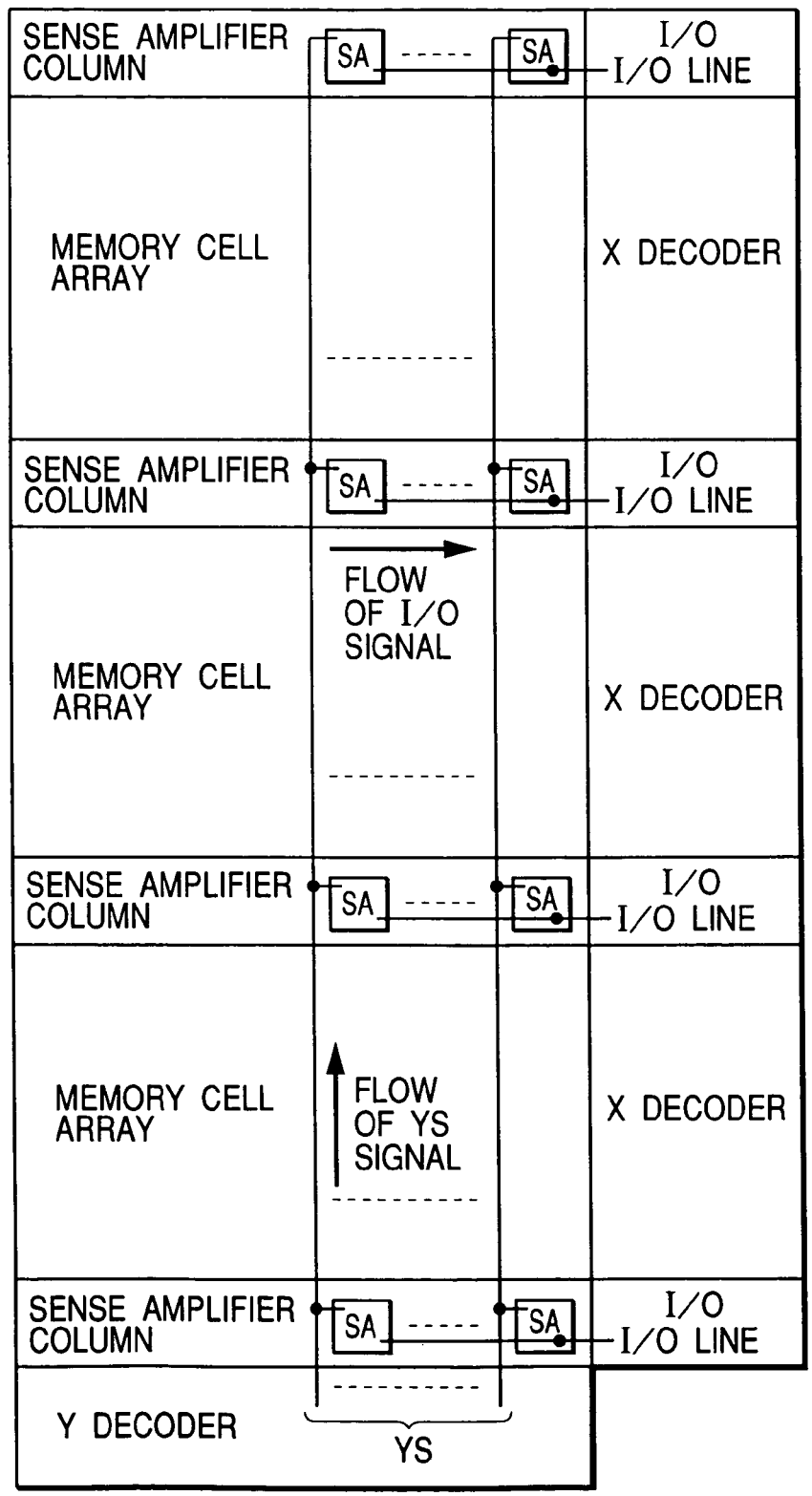
FIG. 8 is a diagram for describing an example of layout of the principal portion of the DRAM.

In the ordinary DRAM, the number of Y selection lines is larger than the number of I/O lines. In this case, as illustrated in FIG. 8, the Y selection lines YS are wired to cross the sense amplifier columns, while the I/O lines are wired to cross the Y selection lines YS in order to obtain the wiring area of the Y selection lines YS.

Figure 9:
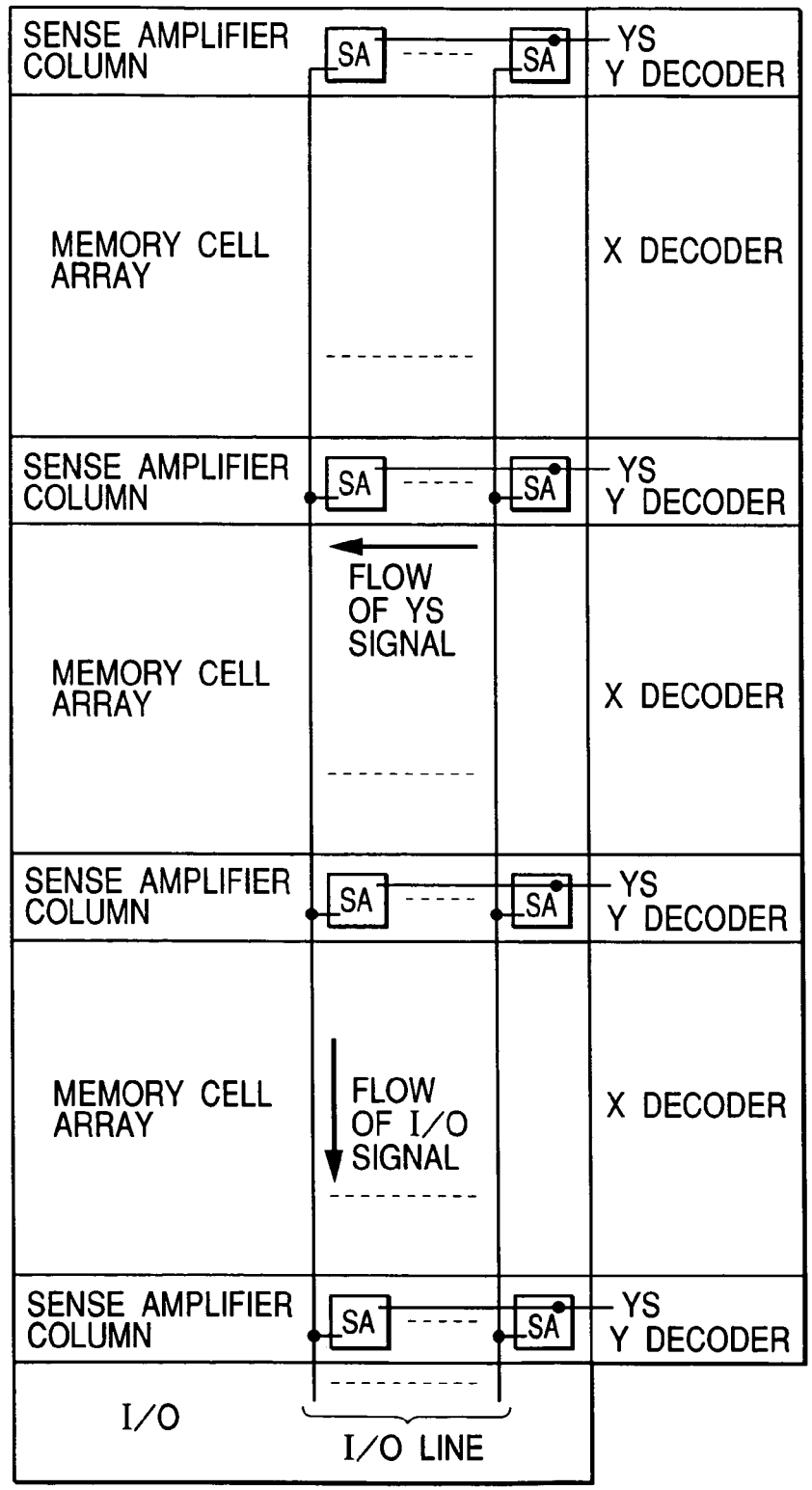
FIG. 9 is a diagram for describing an example of layout of the principal portion of the DRAM.

Meanwhile, when the number of I/O lines is larger than the number of Y selection lines YS as in the case of the DRAM which is mounted, for example, to a microcomputer, the data transfer speed may be improved by reading many bits almost simultaneously. In this case, as illustrated in FIG. 9, the I/O lines are allocated to cross the sense amplifier columns, while the Y selection lines YS are wired in parallel to the sense amplifier columns in order to obtain the wiring area of the I/O lines. In this embodiment, since the Y selection line YS is divided into the Y selection lines WYS for write and the Y selection line RYS for read, the total number of Y selection lines may be doubled in comparison with the case where the Y selection line is not divided into those for write and read. Accordingly, in the layout illustrated in FIG. 8, the total number of Y selection lines increases enormously and thereby it becomes difficult to obtain the wiring area of the Y selection lines YS. On the other hand, in the layout illustrated in FIG. 9, the original number of Y selection lines YS is rather small and therefore if the total number of Y selection lines YS is doubled, the wiring area of the Y selection lines YS may be obtained rather easily. Accordingly, in this embodiment, the wiring area of the Y selection lines YS is obtained by introducing the layout (FIG. 9) which is suitable for the small number of Y selection lines YS.

Next, the wiring structures of the sense amplifier circuit SA and the Y selection lines YS will be described.

Figure 10:
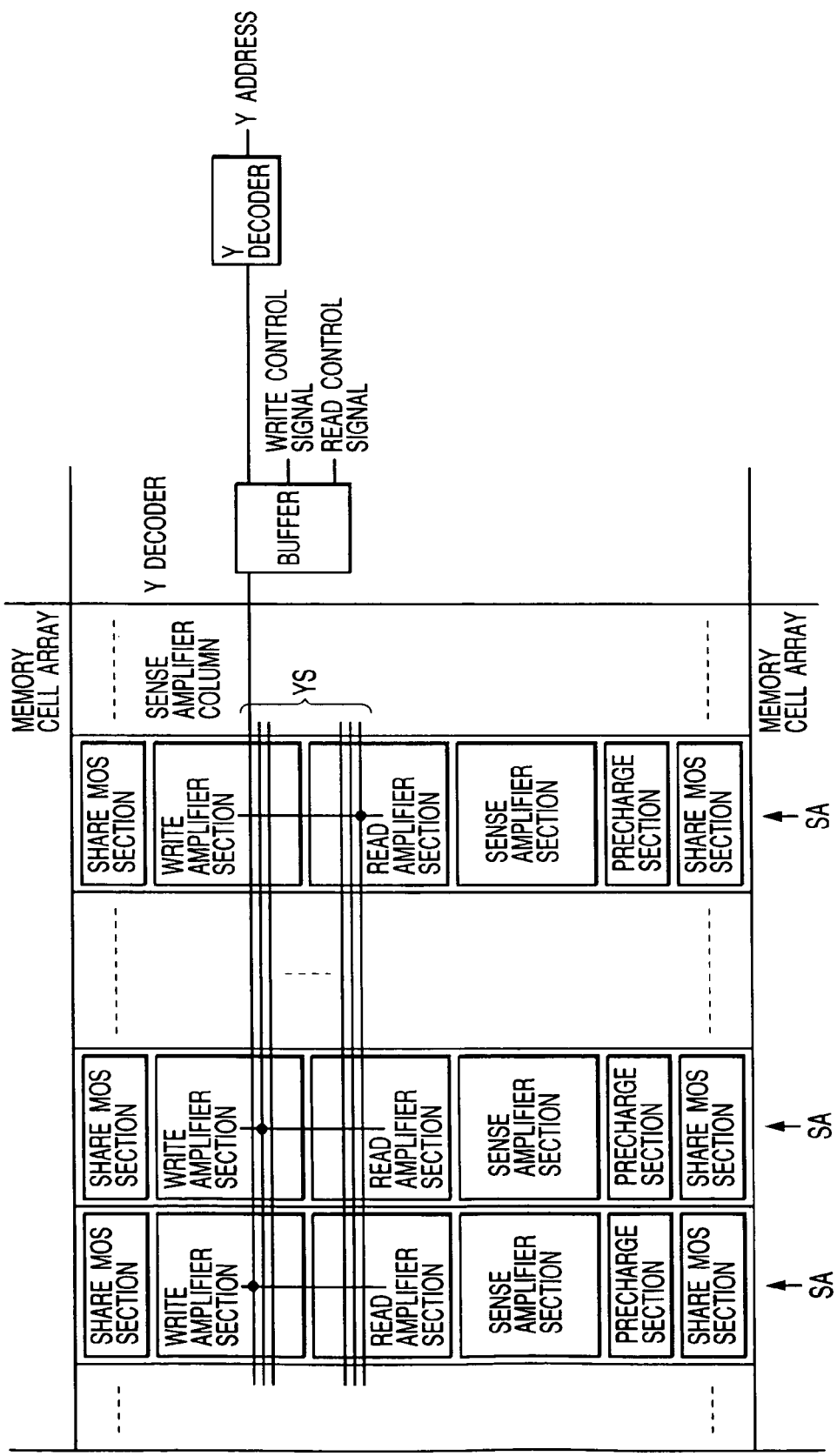
FIG. 10 is a diagram for describing an example of layout of the principal portion of the DRAM.

As illustrated in FIG. 10, the sense amplifier circuit SA is provided, in addition to the sense amplifier section to amplify a low-level signal of the bit line, with a write amplifier section for data write, a read amplifier section for data read, a precharge section for precharge of bit line, and a share MOS section to selectively amplify the signal of the right and left complementary bit lines around the sense amplifier section.

Figure 11:
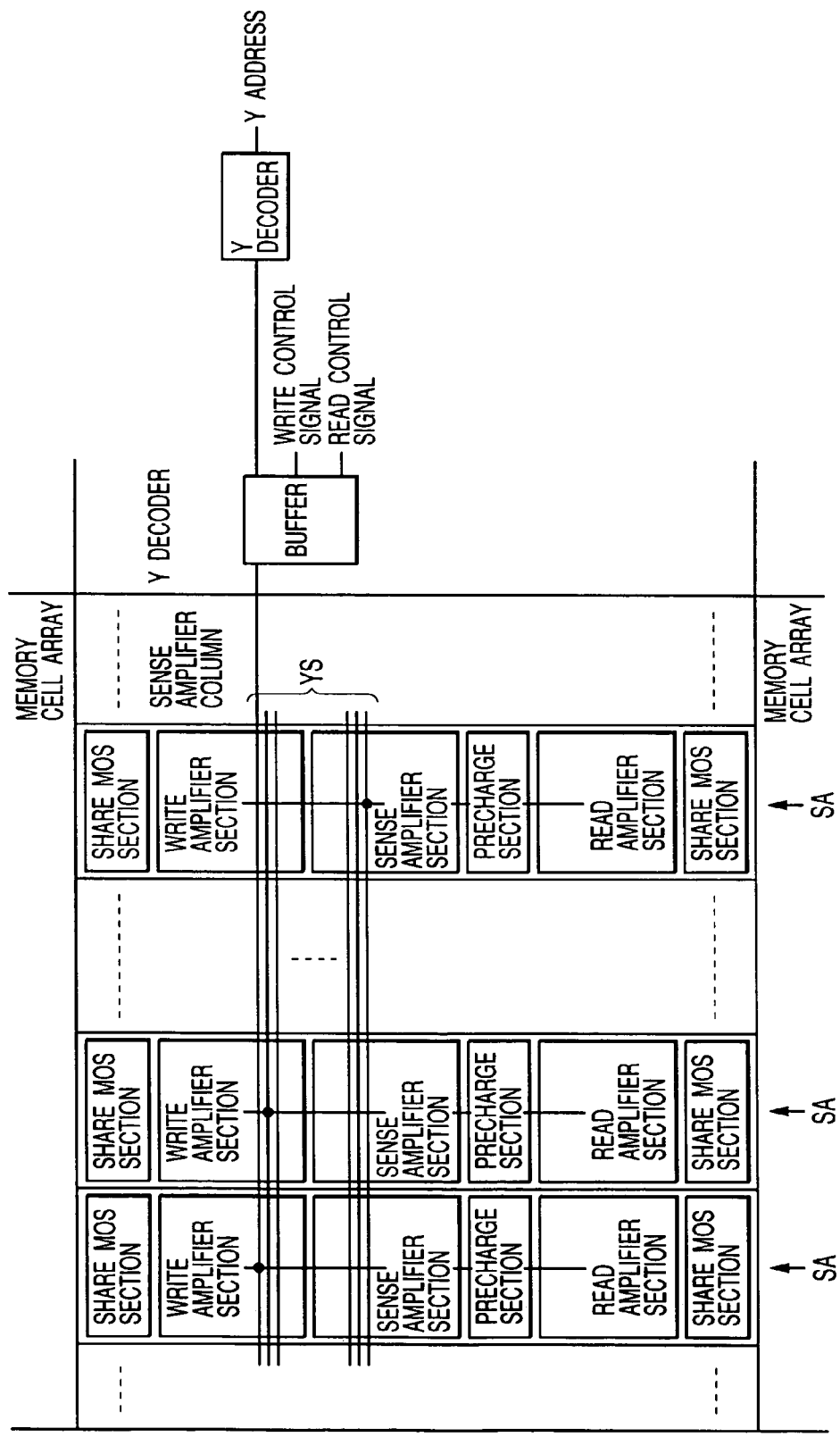
FIG. 11 is a diagram for describing an example of layout of the principal portion of the DRAM.

In the structures illustrated in FIG. 10 and FIG. 11, the Y selection line YS is not divided into the Y selections lines for write and read as in the case of FIG. 2. In the structure of FIG. 10, the write amplifier section and read amplifier section are allocated adjacently in order to alleviate a load by shortening as much as possible the wiring for distributing the Y selection line YS. On the other hand, in the structure of FIG. 11, since the write amplifier section and read amplifier section are not allocated adjacently, the wiring for distributing the Y selection line YS becomes longer than that in FIG. 10 and a load becomes heavier. As a result, the selection time of Y selection line may be delayed.

Figure 12:
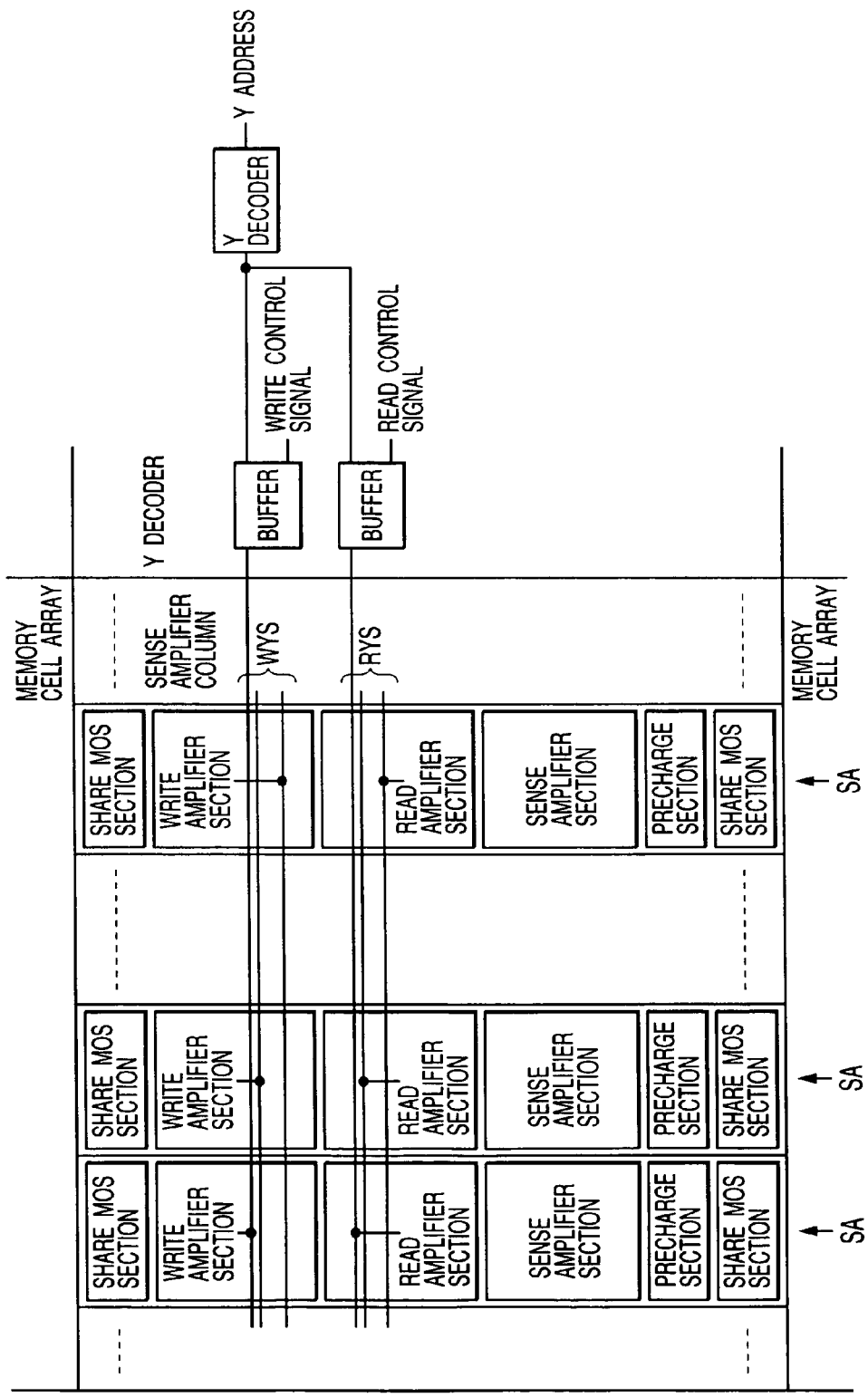
FIG. 12 is a diagram for describing an example of layout of the principal portion of the DRAM.
Figure 13:
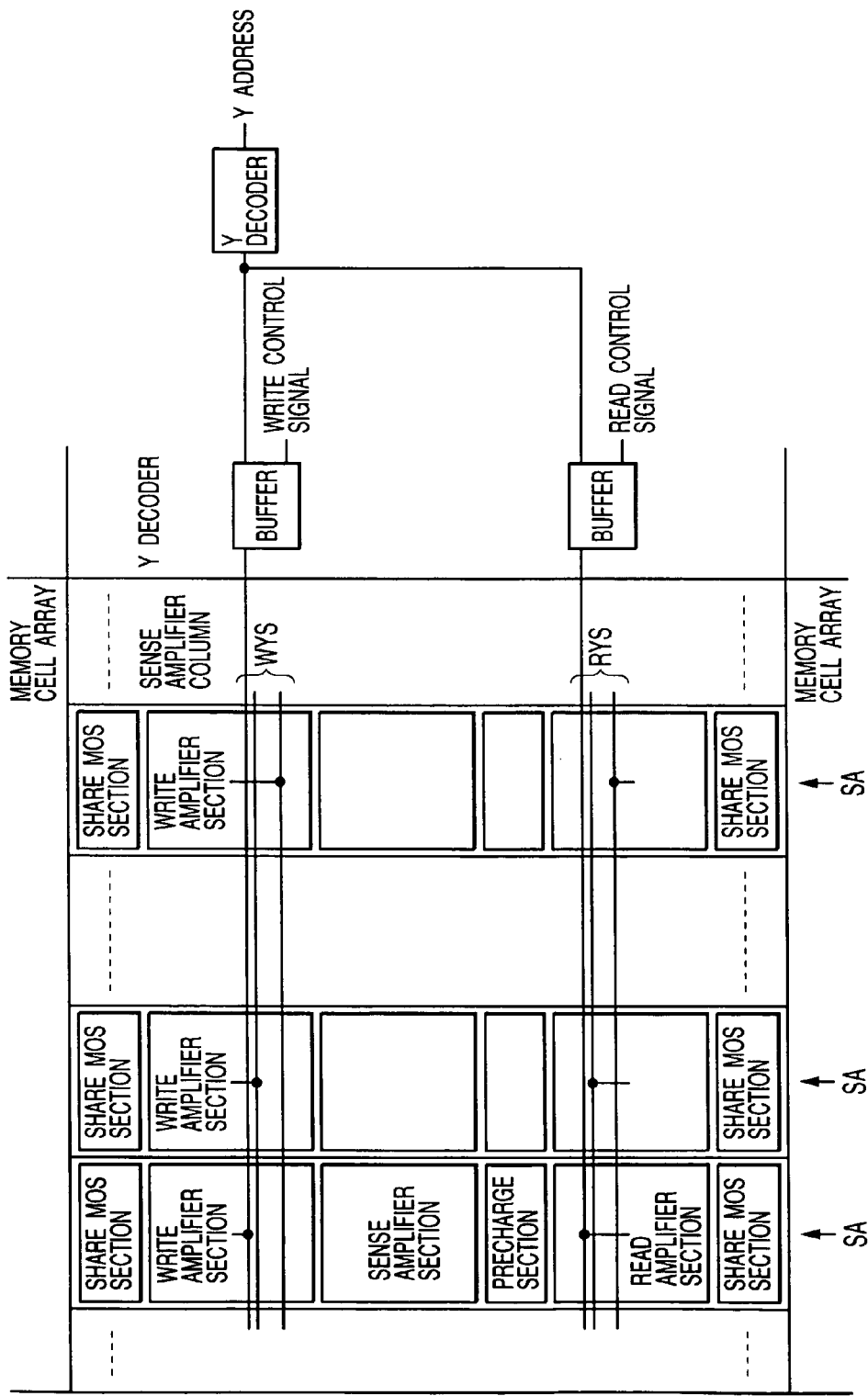
FIG. 13 is a diagram for describing an example of layout of the principal portion of the DRAM.

In the structures illustrated in FIG. 12 and FIG. 13, the Y selection line YS is divided into the Y selection line WYS for write and the Y selection line RYS for read as in the case of FIG. 1. In the structure of FIG. 12, the write amplifier section and the read amplifier section are allocated adjacently, the Y selection line WYS for write is wired using the wiring layer in the area where the write amplifier section is formed, and the Y selection line RYS for read is wired using the wiring layer in the area where the read amplifier section is formed. In the structure of FIG. 13, the sense amplifier section and the precharge section are allocated between the write amplifier section and the read amplifier section, the Y selection line WYS for write is wired using the wiring layer in the area where the write amplifier section is formed, and the Y selection line RYS for read is wired using the wiring layer in the area where the read amplifier section is formed. In the case where the Y selection line is not divided into the Y selection line WYS for write and the Y selection line RYS for read as described above, even when the write amplifier section and the read amplifier section are allocated adjacently as illustrated in FIG. 12 and even when the sense amplifier section and the precharge section are allocated between the write amplifier section and the read amplifier section as illustrated in FIG. 13, load of wiring is never increased and thereby the degree of freedom of wiring can be improved by wiring the Y selection line WYS for write using the wiring layer in the area where the write amplifier section is formed and also by wiring the Y selection line RYS for read using the wiring layer in the area where the read amplifier section is formed.

Figure 14:
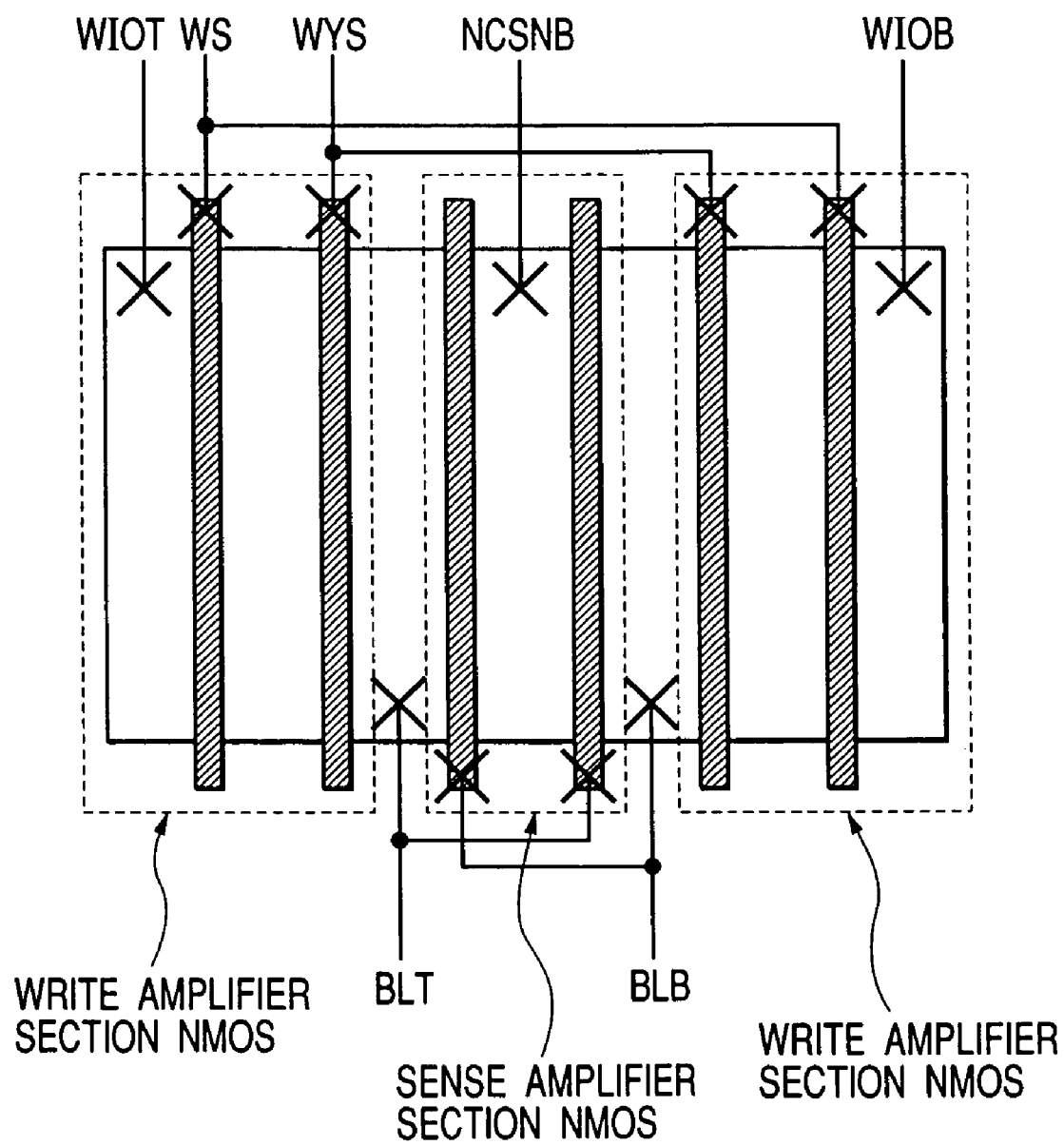
FIG. 14 is a diagram for describing an example of layout of the principal portion of the DRAM.

For the n-channel MOS transistor (NMOS) which forms the sense amplifier section and the write amplifier section, it is possible to introduce the layout in which the diffused layers are used in common as illustrated in FIG. 14. Meanwhile, in the read amplifier section, it is impossible to use in common the diffused layer because the bit line is coupled with the gate electrodes of the MOS transistors. Restrictive conditions of layout between the read amplifier section and write amplifier section may be reduced by isolating the Y selection lines into the Y selection line WYS for write and the Y selection line RYS for read. As a result, degree of freedom of layout may be increased and it is now possible to use in common the diffused layer with the other circuits by isolating the read amplifier section from the sense amplifier section.

The embodiment described above of the present invention provides the following effects.

(1) In the circuit structure illustrated in FIG. 1, since the Y selection line WYS for write to control operations of the column selection switch (112, 114) within the write amplifier 110 is isolated from the Y selection line RYS for read to control operations of the column selection switch (121, 123) within the read amplifier 120, the column selection switch (121, 123) within the read amplifier 120 may be set to the non-operating condition during the write operation. Accordingly, a through-current as illustrated in FIG. 6 does not flow during the write operation.

(2) Since the Y selection line is divided into the Y selection line WYS for write and the Y selection line RYS for read, the load viewed from the corresponding Y decoders 159, 161, 162, 164 may be reduced to half of that in FIG. 2. Accordingly, the high-speed drive of the column selection switch can be realized.

(3) When the IO line is precharged earlier to realize high-speed read operation, the through-current increases and therefore the shorter selection period of the Y selection line RYS for read is recommended. Meanwhile, during the write operation, the high level period of the Y selection line WYS for write must be extended to surely write the data to the memory cell. According to this embodiment, since the Y selection line is divided into the Y selection line WYS for write and the Y selection line RYS for read, the column selection switch (112, 114) within the write amplifier 110 and the column selection switch (121, 123) within the read amplifier 120 can be controlled for operation in different timings. Accordingly, following timing control may be realized easily, namely the period to set the Y selection line RYS for read to the high level is shortened to realize high-speed precharge operation, while the period to set the Y selection line WYS for write to the high level is extended in order to write the data to the memory cell during the write operation. Particularly, during the read operation, high-speed read operation can be realized by executing the following timing control. Namely, increase of the through-current generated when the precharge timing is set earlier may be eliminated by realizing quick precharge by asserting quickly the IO precharge control signal RIOPR for read as illustrated by the broken line in FIG. 4 in order to realize high-speed read operation and thereby quickly setting the Y selection line RYS for read to the non-operating condition. Such control may be realized by fetching the main amplifier control signal MAC outputted from the main amplifier control circuit 169 as the decoding condition in the Y decoders 159, 161, 162, and 164. In other words, the timing to set the Y selection line RYS for read to the non-selecting condition can be determined by referring to the IO precharge control signal RIOPR for read included in the main amplifier control signal MAC in the Y decoders 159, 161, 162, and 164.

(4) The sense amplifier circuit is required to form the circuit within the width which is determined with the layout pitch of the bit line. For this purpose, there is a large restriction on the original layout itself and therefore many trials have been attempted to reduce the layout area. When the write amplifier section and the read amplifier section are isolated, the signal must be sent to both write amplifier section and the read amplifier section. Therefore, the length of wiring becomes longer and load of wiring becomes heavier in the system where the Y selection line is not isolated. As a result, performance of circuit is deteriorated, for example, operation of the column selection switch is delayed. On the other hand, when the Y selection line is divided into the Y selection line WYS for write and the Y selection line RYS for read like this embodiment, load of wiring is never increased and a degree of freedom of layout can therefore be improved by wiring the Y selection line WYS for write using the wiring layer in the area where the write amplifier section is formed and by wiring the Y selection line RYS for read using the wiring layer in the area where the read amplifier section is formed even when the write amplifier section and the read amplifier section are allocated adjacently as illustrated in FIG. 12 and even when the sense amplifier section and precharge section are allocated between the write amplifier section and the read amplifier section as illustrated in FIG. 13.

(5) Since the Y selection line is divided into the Y selection line WYS for write and the Y selection line RYS for read, the total number of Y selection lines is doubled in comparison with the case where the Y selection line is not isolated. Therefore, in the layout illustrated in FIG. 8, the total number of Y selection lines becomes enormous and thereby it is difficult to obtain the wiring area of the Y selection line. However, in the layout illustrated in FIG. 9, the number of Y selection lines is originally small and therefore even when the total number of Y selection lines is doubled, the wiring area of the Y selection line can be obtained rather easily. Accordingly, the wiring area of the Y selection line can be obtained by introducing the layout (FIG. 9) where the number of Y selection lines is rather small.

The present invention has been described above practically but the present invention is not limited only to the invention described above and also allows various changes or modifications within the scope not departing the claims thereof.

Figure 7:
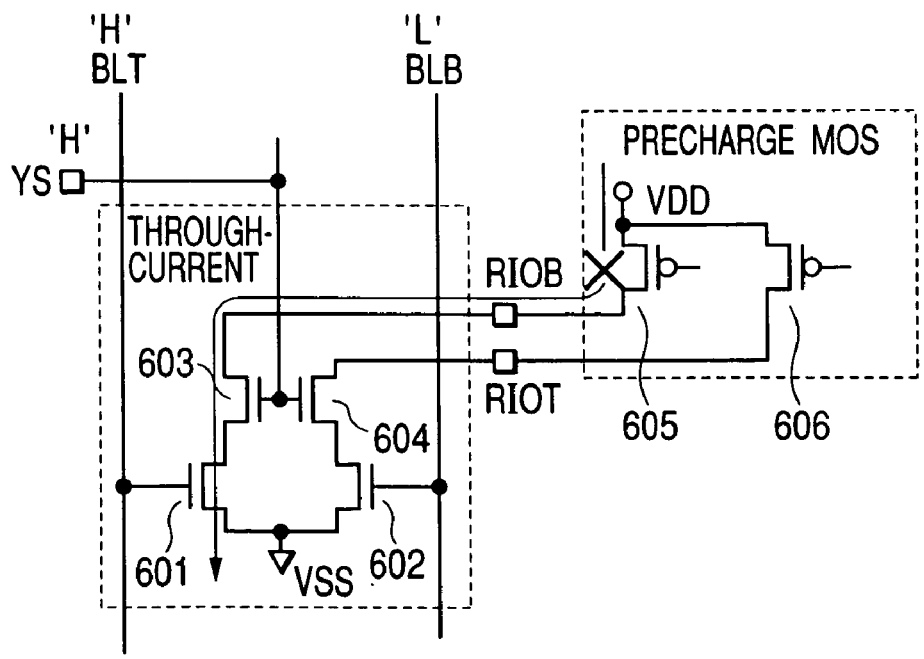
FIG. 7 is a circuit diagram illustrating a means for blocking the through-current of FIG. 6.

For example, as the other means for reducing the through-current, it is considered, as illustrated in FIG. 7, to control the p-channel MOS transistors 605, 606 for precharging the read IO line to the OFF (non-conductive) state during the write operation. Since the p-channel MOS transistors 605, 606 are controlled to the OFF (non-conductive state during the write operation, the through-current generated during the write operation may be reduced.

In above description, the present invention has been adapted to the DRAM which is the application field for describing the background thereof, but the present invention is never limited thereto and may also be widely adapted to various semiconductor memory devices and the semiconductor integrated circuits comprising such memory devices.

The present invention can be adapted under the condition that it includes at least a means for enabling the read and write operations of data.

As described above, the present invention can provide the following effects.

Namely, since the column selection switch for write and the column selection switch for read may be operated respectively in different timings, the column selection switch within the read amplifier may be set to the non-operating condition during the write operation. Accordingly, the through-current generated during the write operation may be reduced. In this case, the wiring area of column selection line can be obtained by allocating the write IO line and the read IO line to cross the sense amplifier columns and by allocating the column selection line for write and the column selection line for read in parallel to the sense amplifier columns.

What is claimed is:

1. A semiconductor memory device comprising:
a write signal line to transmit write data;
a write buffer coupled to the write signal line to output the write data;
a write column selection switch being possible to transmit said write data on said write signal line to a bit line;
a write column selection line supplying an operation control signal to said write column selection switch;
a sense amplifier column comprising a plurality of sense amplifier circuits to amplify read data which are read to said bit line from a memory cell;
a read signal line to transmit read data, said read signal line being different from said write signal line;
a main amplifier coupled only to the read signal line to amplify the read data on the read signal line;
a read column selection switch to selectively transmit the read data of said bit line to said read signal line;
a read column selection line supplying an operation control signal to said read column selection switch; and
a control circuit to control operations of said write column selection switch and read column selection switch in different timings,
wherein said write signal line and said read signal line are allocated crossing said sense amplifier column and said write column selection line and said read column selection line are allocated in parallel to said sense amplifier column,
the write data is transferred from the write buffer to said bit line via the write signal line, and the read data is transferred from said bit line to said main amplifier via the read signal line, and
a period of activating the read column selection switch is shorter than a period of activating the write column selection switch.

2. The semiconductor memory device according to claim 1,
wherein said sense amplifier circuit comprises a write amplifier section to drive said bit line based on the data of said write signal line and a read amplifier section to drive said read signal line based on the data of said bit line,
wherein said write column selection line is provided using a wiring layer in a first area where said write amplifier section is formed, and
wherein said read column selection line is provided using a wiring layer in a second area where said read amplifier section is formed.

3. The semiconductor memory device according to claim 2, wherein the sense amplifier column is allocated between the first area and the second area.

4. The semiconductor memory device according to claim 1, further comprising a plurality of dynamic memory cells coupled to said bit line.

* * * * *